(12) United States Patent
Nomoto et al.

(10) Patent No.: US 7,049,655 B2
(45) Date of Patent: *May 23, 2006

(54) NON-VOLATILE SEMICONDUCTOR MEMORY DEVICE AND PROCESS FOR FABRICATING THE SAME

(75) Inventors: Kazumasa Nomoto, Kanagawa (JP); Toshio Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/093,376

(22) Filed: Mar. 30, 2005

(65) Prior Publication Data

US 2005/0167735 A1     Aug. 4, 2005

Related U.S. Application Data

(63) Continuation of application No. 10/101,191, filed on Mar. 19, 2002, now Pat. No. 6,885,060.

(30) Foreign Application Priority Data

Mar. 19, 2001    (JP) .............................. 2001-079123

(51) Int. Cl.
    *H01L 29/788*    (2006.01)
(52) U.S. Cl. ..................................... 257/316
(58) Field of Classification Search ........ 438/257–267; 257/316–323
    See application file for complete search history.

(56) References Cited

U.S. PATENT DOCUMENTS 5,180,680 A    1/1993  Yang .......................... 438/259
6,054,349 A    4/2000  Nakajima et al. ............ 438/257
6,060,743 A    5/2000  Sugiyama et al. .......... 257/321

(Continued)

OTHER PUBLICATIONS

Eitan et al., "Can NROM, a 2 Bit, Trapping Storage NVM Cell, Give a Real Challenge to Floating Gate Cells?" Extended Abstracts of the 1999 International Conference on Solid State Devices and Materials, pp. 522-524.

(Continued)

*Primary Examiner*—Richard A. Booth
(74) *Attorney, Agent, or Firm*—Sonnenschein Nath & Rosenthal LLP

(57) ABSTRACT

A non-volatile semiconductor memory device comprising a first conductive semiconductor having steps on a surface thereof, a second conductive semiconductor region formed on an upper portion and a bottom portion of each of the steps and being separated in a direction perpendicular to the main surface of the first conductive semiconductor to function as a source or a drain, a gate dielectric film containing therein charge storage means which is spatially discrete and being formed on the first conductive semiconductor so as to coat at least a sidewall of each of the steps, and a gate electrode formed on the gate dielectric film. Accordingly, there are provided a non-volatile semiconductor memory device which suffers almost no deterioration in the properties and can perform the operation of recording of 2 bits per unit memory device even when the size of the semiconductor memory device in the semiconductor substrate is scaled down, and a process for fabricating the non-volatile semiconductor memory device.

19 Claims, 8 Drawing Sheets

U.S. PATENT DOCUMENTS

| | | | |
|---|---|---|---|
| 6,090,666 A | 7/2000 | Ueda et al. | 438/257 |
| 6,163,049 A | 12/2000 | Bui | 257/321 |
| 6,300,193 B1 | 10/2001 | Forbes | 438/257 |
| 6,413,819 B1 | 7/2002 | Zafar et al. | 438/257 |
| 6,444,545 B1 | 9/2002 | Sadd et al. | 438/503 |
| 6,596,590 B1 | 7/2003 | Miura et al. | 438/261 |
| 6,885,060 B1 * | 4/2005 | Nomoto et al. | 257/324 |

OTHER PUBLICATIONS

Khare et al., "Highly Robust Ultra-Thin Gate Dielectric for Giga Scale Technology," 1998 Symposium on VLSI Technology Digest of Technical Papers, pp. 218-219.

Song et al., "Ultra Thin (<20 Å) CVD $Si_3N_4$ Gate Dielectric for Deep-Sub-Micron CMOS Devices," IEEE, 1998, pp. 14.1.1-14.1.4.

* cited by examiner

NON-VOLATILE SEMICONDUCTOR MEMORY DEVICE AND PROCESS FOR FABRICATING THE SAME

CROSS REFERENCES TO RELATED APPLICATIONS

This is a continuation of U.S. patent application Ser. No. 10/101,191, entitled, "Non-volatile Semiconductor Memory Device and Process for Fabricating the Same," filed Mar. 19, 2002 now U.S. Pat. No. 6,885,060, which claimed priority to Japanese Priority Document JP 2001-079123, filed Mar. 19, 2001, both of which are hereby incorporated by reference in their respective entireties.

BACKGROUND OF THE INVENTION

1. Field of the Invention

The present invention relates to a non-volatile semiconductor memory device having charge storage means which is two-dimensionally discrete, for example, a charge trap in the nitride film in a metal oxide nitride oxide semiconductor (MONOS) type device or metal nitride oxide semiconductor (MNOS) type device, wherein the device records or erases data by injecting charges into or taking out charges from the charge storage means, and a process for fabricating the non-volatile semiconductor memory device.

2. Description of the Related Art

As non-volatile semiconductor memory devices, there are known floating gate (FG)-type memory devices in which a charge storage means (floating gate) for storing charges is two-dimensionally continued, and MONOS-type memory devices and MNOS-type memory devices in which a charge storage means (e.g., carrier trap) is two-dimensionally discrete.

In the MONOS-type memory devices, on a semiconductor substrate where a channel is formed, an oxide nitride oxide (ONO) film and a gate electrode are stacked on one another, and, in the substrate surface regions on both sides of the resultant stacked layer pattern, source-drain regions each having the opposite conductivity to the channel are formed.

Writing is conducted by injecting charges from the substrate into an insulating film having charge storage ability. On the other hand, erasing is conducted by taking out the stored charges to the substrate or injecting into the insulating film charges having the opposite polarity to the stored charges.

In the above-mentioned conventional MONOS-type memory devices, a channel is formed on the surface of a flat single crystal silicon substrate.

Further, in recent years, with respect to the MONOS-type memory device having a channel in the semiconductor substrate and having silicon nitride ($SiN_X$) as a charge storage layer, a semiconductor memory device has been reported in which electrons are locally written in a source end or a drain end using hot electron injection to make it possible to store charges independently, enabling recording of 2 bits per memory device (see Boaz Eitan, et al., Extended Abstracts of the 1999 International Conference on Solid State Device and Materials, Tokyo, 1999, pp. 522).

However, when a channel is formed on the surface of a flat single crystal silicon substrate, for improving the degree of integration of the data recording density, the size per unit memory device in the substrate must be scaled down.

Therefore, for achieving the scaled-down semiconductor memory device, the length of the channel (channel length) between the source region and the drain region in the semiconductor memory device must be shortened. However, the shortening of the gate length causes a so-called short channel effect, and typically, when the gate length is 0.1 μm or shorter, the transistor properties of the semiconductor memory device disadvantageously become poor.

In addition, in the above-mentioned semiconductor memory device in which a channel is formed in the semiconductor substrate and electrons are locally written in the source end or the drain end in the discrete charge storage layer using hot electron injection to enable recording of 2 bits per unit memory device, when the channel length is shortened, the charge storage regions of the source end and the drain end in which electrons are locally written overlap, so that the two different regions that electrons are separately written cannot be distinguished from each other, making it impossible to perform the operation of recording of 2 bits per unit memory device.

SUMMARY OF THE INVENTION

Therefore, in view of the above-mentioned conventional problem, the present invention provides a non-volatile semiconductor memory device which suffers almost no deterioration in the properties even when the size of the semiconductor memory device in the semiconductor substrate is scaled down, as compared to the semiconductor memory device having a channel in a flat semiconductor substrate, and a process for fabricating the non-volatile semiconductor memory device.

Further, the present invention also provides a non-volatile semiconductor memory device which can perform the operation of recording of 2 bits per unit memory device even when the size of the semiconductor memory device in the semiconductor substrate is scaled down, and a process for fabricating the non-volatile semiconductor memory device.

According to the present invention, there is provided a non-volatile semiconductor memory device which comprises: a first conductive semiconductor having a plurality of steps on a surface thereof; a second conductive semiconductor region formed on an upper portion and a bottom portion of each of the steps and being separated in a direction perpendicular to a main surface of the first conductive semiconductor to function as a source or a drain; a gate dielectric film containing therein a charge storage means which is spatially discrete and being formed on the first conductive semiconductor so as to coat at least a sidewall of each of the steps; and a gate electrode formed on the gate dielectric film.

Preferably, a plurality of memory transistors each having the second conductive semiconductor region which functions as a source or drain region, the gate dielectric film, and the gate electrode are arranged in a matrix form having rows and columns, wherein the steps are formed to extend in a column direction at a predetermined interval in the row direction, wherein the second conductive semiconductor region formed on the bottom portion of each of the steps and the second conductive semiconductor region formed on the upper portion of each of the steps are respectively disposed in and shared by two adjacent one of the memory transistors in the row direction, wherein a plurality of the gate electrodes are arranged so as to extend in the row direction and are individually disposed between the memory transistors in the row direction and separated at a predetermined interval in the column direction.

The gate dielectric film may comprise a lower dielectric film formed on the first conductive semiconductor, and a charge storage film formed on the lower dielectric film, wherein the charge storage film is comprised mainly of the charge storage means.

The lower dielectric film may comprise, for example, a single film selected from or a laminated film comprised of two or more films selected from the group consisting of a silicon dioxide film, a silicon oxide nitride film which has no trap or does not have traps in an amount enough to change the threshold voltage of a transistor, a film comprised of an oxide of tantalum, titanium, zirconium, hafnium, lanthanum, or aluminum, and a film comprised of a silicate of tantalum, titanium, zirconium, hafnium, or lanthanum.

The charge storage film may comprise, for example, a single film selected from or a laminated film comprised of two or more films selected from the group consisting of a silicon nitride film, a silicon oxide nitride film, a film comprised of an oxide of tantalum, titanium, zirconium, hafnium, lanthanum, or aluminum, and a film comprised of a silicate of tantalum, titanium, zirconium, hafnium, or lanthanum.

For example, the gate dielectric film may contain therein, as the charge storage means, a plurality of small particle-size conductors which are insulated from one another.

For example, the gate dielectric film may comprise an upper dielectric film formed on the charge storage film.

The upper dielectric film may comprise, for example, a single film selected from or a laminated film comprised of two or more films selected from the group consisting of a silicon dioxide film, a silicon oxide nitride film which has no trap or does not have traps in an amount enough to change the threshold voltage of the transistor, a film comprised of an oxide of tantalum, titanium, zirconium, hafnium, lanthanum, or aluminum, and a film comprised of a silicate of tantalum, titanium, zirconium, hafnium, or lanthanum.

In the non-volatile semiconductor memory device of the present invention, the second conductive semiconductor region which function as a source or a drain is formed on the upper portion and the bottom portion of each of the steps in the first conductive semiconductor, and the channel is formed on the sidewall between the source and the drain. Therefore, the channel length does not affect the size of the memory transistor in the first conductive semiconductor.

Further, the height in a direction perpendicular to the main surface (height direction) of the first conductive semiconductor need not be reduced particularly. Therefore, the degree of integration of the memory transistor can be improved without shortening the channel length of the memory transistor.

Further, according to the present invention, there is provided a process for fabricating the non-volatile semiconductor memory device of the present invention, the process comprising the steps of: forming a plurality of steps on a main surface of a first conductive semiconductor; forming a gate dielectric film on the first conductive semiconductor so as to coat at least a sidewall of each of the steps, wherein the gate dielectric film contains therein charge storage means which is spatially discrete; introducing a second conductive impurity into the first conductive semiconductor having the steps to form, on an upper portion and a bottom portion of each of the steps, a second conductive semiconductor region which functions as a source or a drain; and depositing a conductive film on the gate dielectric film and processing the resultant conductive film to form a gate electrode.

In the above-mentioned process, after the step of forming the plurality of steps on the main surface of the first conductive semiconductor and before forming a gate dielectric film, the second conductive semiconductor region may be formed.

In the process for fabricating the non-volatile semiconductor memory device of the present invention, simply by adding the step of forming the plurality of steps in the semiconductor substrate, a non-volatile semiconductor memory device having an improved degree of integration can be produced.

Further, in the step of forming the steps in the main surface of the first conductive semiconductor, when, for example, an etching process having strong anisotropy is employed for improving the verticality of the steps, the sidewall of each of the steps is likely to suffer at least a small damage. In such a case, the gate dielectric film present near the sidewall of each of the steps, which suffers damage, can be a dielectric film having a number of defects. However, since the charge storage means is spatially discrete, merely the charges stored in the charge storage means near the defects leak.

The non-volatile semiconductor memory device of the present invention suffers almost no deterioration in the properties and can perform the operation of recording of 2 bits per unit memory device even when the size of the semiconductor memory device in the first conductive semiconductor is scaled down, as compared to the semiconductor memory device having a channel in the first conductive semiconductor having a flat surface.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIG. 6A shows up to a step of forming a trench portion in the semiconductor substrate, and FIG. 6B shows up to a step of forming a gate dielectric film;

FIG. 7A shows up to a step of forming a source-drain region, and FIG. 7B shows up to a step of forming a gate electrode.

DETAILED DESCRIPTION OF THE PREFERRED EMBODIMENTS

Hereinbelow, preferred embodiments of the present invention will be described in detail with reference to the accompanying drawings, taking as an example a non-volatile semiconductor memory device having an n-channel MONOS-type memory transistor. Substantially the same explanation as that described below can be made on a p-channel type memory transistor except that the conductivity of the impurity in the memory transistor and the polarity of the carrier and in the conditions for voltage application are individually reversed.

First Embodiment

Figure 1:
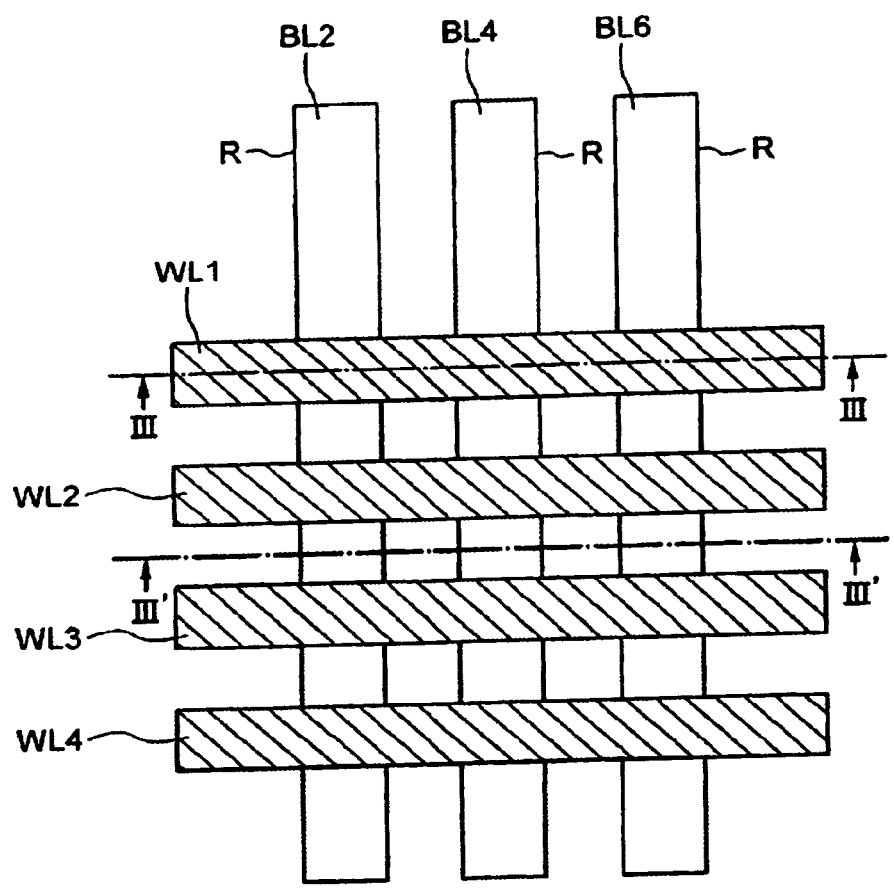
FIG. 1 is a diagrammatic plan view of a memory cell array according to a first embodiment of the present invention.

FIG. 1 is a diagrammatic plan view of a memory cell array according to the present embodiment. As shown in FIG. 1, trenches R are formed in a semiconductor substrate (including an SOI layer) in a stripe form at a predetermined interval, and word lines WL are formed in a stripe form in the direction perpendicular to the trenches R.

Figure 2:
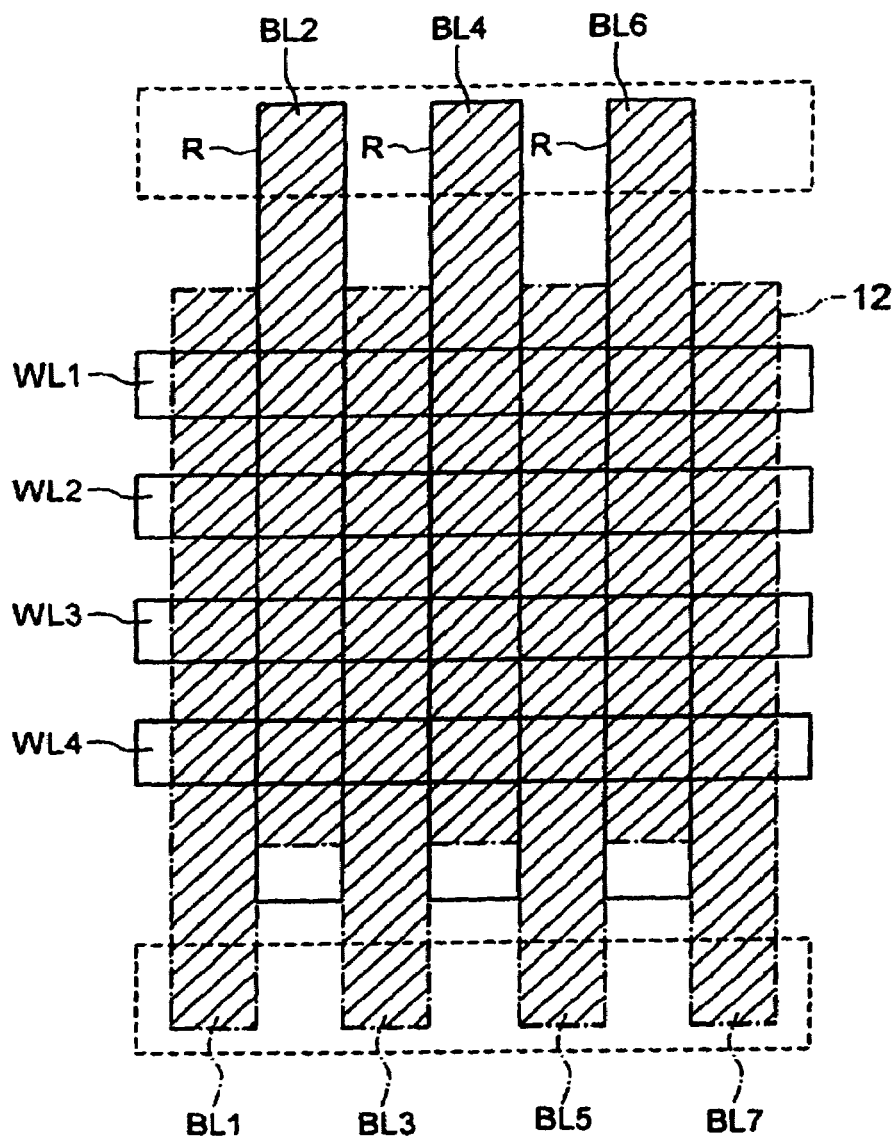
FIG. 2 is a diagrammatic view showing a region in the plan view of FIG. 1, into which an impurity is introduced.

FIG. 2 is a diagrammatic view showing an impurity region formed on the semiconductor substrate shown in the plan view of FIG. 1. As shown in a shaded portion in FIG. 2 indicated by slant lines, an impurity region (source-drain region) 12 which functions as a source or a drain is formed, and the source-drain region 12 at the bottom portions of the trenches R formed in the semiconductor substrate forms bit lines BL2, BL4, BL6. The source-drain region 12 on the semiconductor substrate, in which no trench R is formed, forms bit lines BL1, BL3, BL5, BL7.

Thus, the bit lines BL comprised of the source-drain region 12 are arranged in parallel in one direction to form the bit lines BL1 to BL7. Although not shown, to the bit lines BL1 to BL7 is connected metal wiring (main source line and main bit line) through contacts.

The figure shows that the source-drain region 12 is referred to as and functions as a bit line BL, but the bit lines BL1 to BL7 function also as source lines depending on the direction of the voltage applied to the source-drain region 12.

Figure 3A:
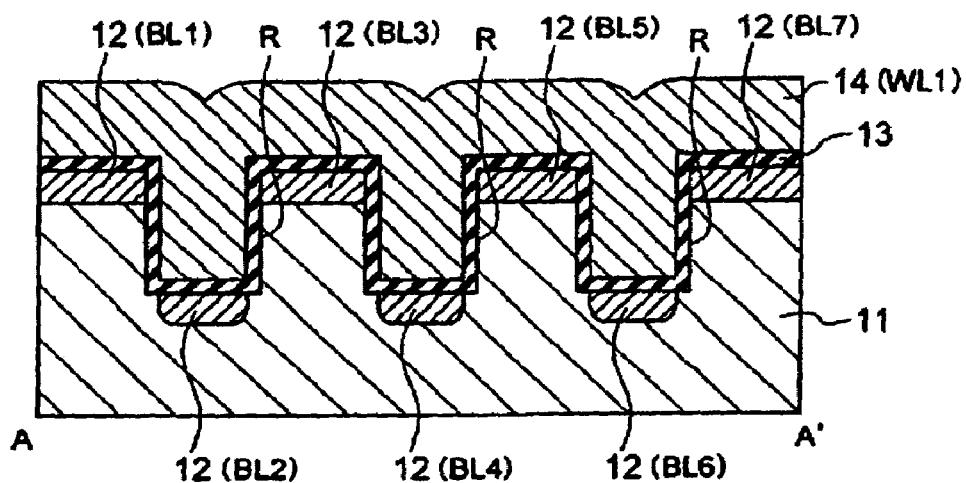
FIG. 3A is a diagrammatic cross-sectional view taken along a line III—III in FIG. 1.
Figure 3B:
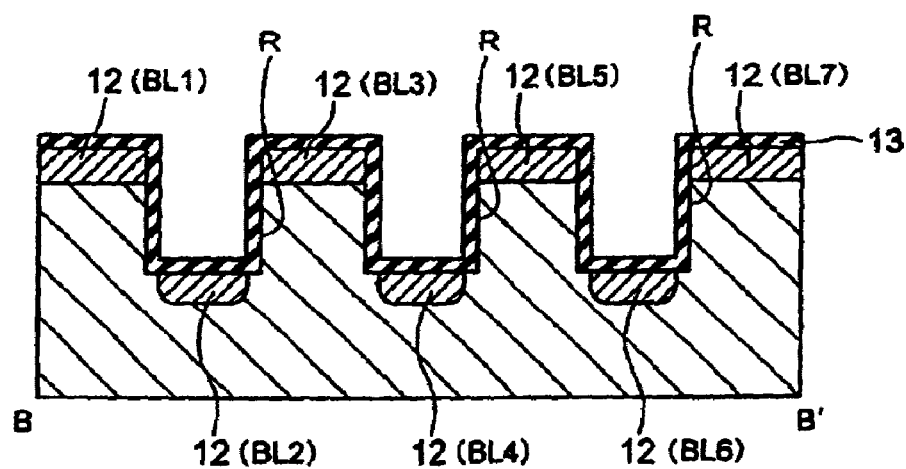
FIG. 3B is a diagrammatic cross-sectional view taken along a line III'—III' in FIG. 1.

FIG. 3A is a diagrammatic cross-sectional view taken along a line III—III in FIG. 1, and FIG. 3B is a diagrammatic cross-sectional view taken along a line III'—III' in FIG. 1.

As shown in FIGS. 3A and 3B, in a semiconductor substrate 11 comprised of, for example, p-type silicon, the above-mentioned trenches R are formed at a predetermined interval to form a plurality of steps comprising alternately formed convex portions (ridges) and concave portions (grooves).

On a bottom surface of each concave portion (groove) and an upper surface of each convex portion (ridge), two source-drain regions 12, into which an n-type impurity is introduced in a high concentration, are formed so as to be separated from each other in a direction perpendicular to the substrate.

A channel formation region is formed between an upper one and a lower one of the source-drain regions 12, that is, formed along a sidewall of each of the steps formed in the semiconductor substrate 11 in the direction perpendicular to the substrate surface.

A dielectric film (gate dielectric film) 13 having charge storage ability is formed by, for example, stacking a plurality of insulating films on one another so as to coat the semiconductor substrate 11 having the steps.

Figure 4:
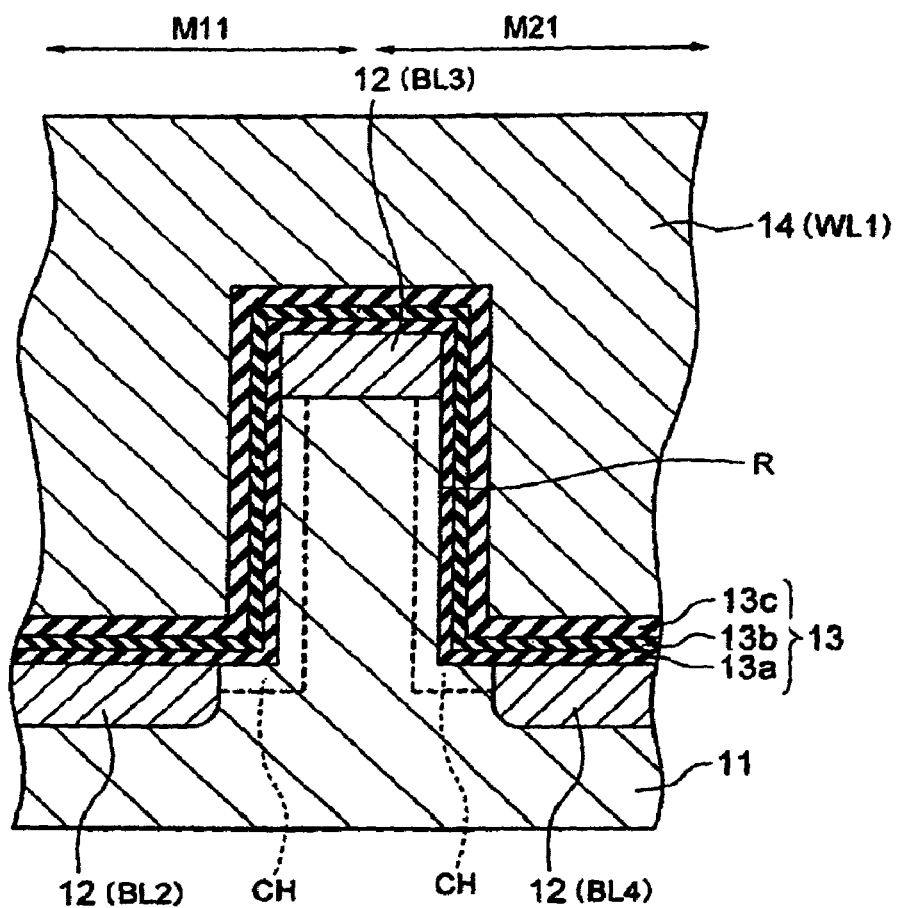
FIG. 4 is an explanatory enlarged diagrammatic cross-sectional view illustrating a detailed structure of a gate dielectric film.

FIG. 4 is an explanatory enlarged diagrammatic cross-sectional view illustrating the detailed structure of the gate dielectric film 13.

As shown in FIG. 4, the gate dielectric film 13 comprises a bottom dielectric film 13a, a charge storage film 13b which is responsible mainly for charge storage, and a top dielectric film 13c in ascending order from the lower layer.

The bottom dielectric film 13a is comprised of a material having a larger band gap than that of the semiconductor substrate 11, for example, a film which has no trap or does not have traps in an amount enough to change the threshold voltage of the transistor, such as silicon dioxide ($SiO_2$), silicon nitride ($SiN_x$; x>0), or silicon oxide nitride ($Si_xO_y$; x, y>0), and has a thickness of about 1 to 20 nm.

The charge storage film 13b is comprised of a material having a smaller band gap than that of the bottom dielectric film 13a and containing a charge trap as a charge storage means, for example, a film comprised of silicon nitride ($SiN_x$; x>0) or silicon oxide nitride ($Si_xO_y$; x, y>0), and has a thickness of about 1 to 20 nm.

The top dielectric film 13c is comprised of a film which has no trap or does not have traps in an amount enough to change the threshold voltage of the transistor, for example, silicon dioxide ($SiO_2$), silicon nitride ($SiN_x$; x>0), or silicon oxide nitride ($Si_xO_y$; x, y>0), and has a thickness of about 3 to 20 nm for effectively inhibiting injection of holes from the gate electrode 14 to prevent the lowering of the endurance for data.

On the gate dielectric film 13, the gate electrode 14 is formed. The gate electrode 14 is comprised of, for example, polycrystalline silicon or amorphous silicon to which an impurity is added, and constitutes the word line WL.

Figure 5:
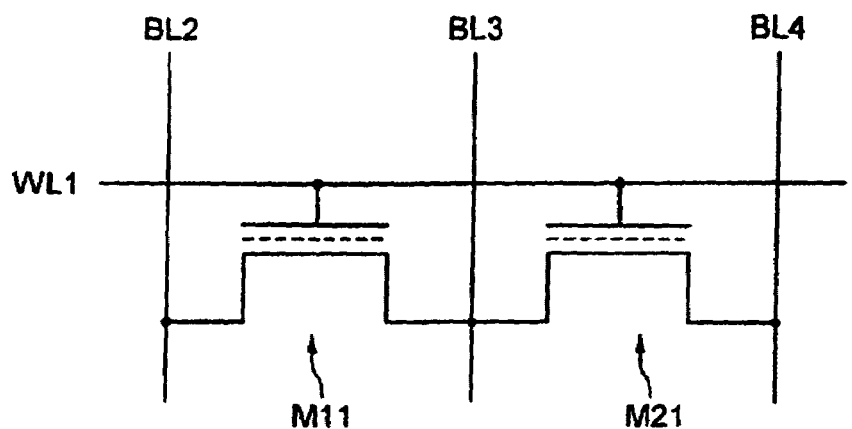
FIG. 5 is an equivalent circuit diagram corresponding to the cross-sectional view of a memory cell array shown in FIG. 4.

FIG. 5 is an equivalent circuit diagram corresponding to the cross-sectional view of the memory cell array shown in FIG. 4.

As shown in FIG. 5, one convex portion and two bottom portions of the concave portions on both sides of the convex portion shown in FIG. 4 form two memory cell transistors.

Specifically, in the memory transistors shown in FIG. 5, the source-drain regions 12 are formed on the upper surface of the convex portion and the bottom portions of the concave portions, and channels CH are formed on the sidewalls of the steps, that is, portions between the upper surfaces of the convex portions and the bottom portions of the concave portions in the semiconductor substrate 11. Therefore, the channels CH are formed on both sides of one convex portion, thus forming two memory transistors. Each bit line BL is connected to the adjacent memory transistors.

Next, a process for fabricating the memory cell shown in FIG. 1 will be described with reference to FIGS. 6A to 7B.

FIGS. 6A to 7B correspond to the cross-sectional structure shown in FIG. 3A.

First, a p-well is formed in a silicon wafer provided by ion implantation of $B^+$ or $BF^+$ if desired. On the surface of the thus prepared semiconductor substrate 11 on which a memory transistor is formed, a not shown resist having a pattern for forming the trenches R shown in FIG. 1 is formed by a photolithography technique, and subjected to reactive ion etching (RIE) having anisotropy using the resist as a mask to form the trenches R in a stripe form.

Alternatively, a dielectric film may be formed on the region of the semiconductor substrate in which the trenches R are not formed, and subjected to etching using the dielectric film as a mask to form the trenches R in a stripe form.

Next, the not shown resist is removed, and a gate dielectric film 13 is then formed on the semiconductor substrate 11 in which the trenches R are formed in a stripe form.

First, as the bottom dielectric 13a shown in FIG. 4, a film comprised of, for example, silicon dioxide ($SiO_2$), silicon nitride ($SiN_x$; x>0), or silicon oxide nitride ($SiO_xN_y$; x, y>0) is deposited so as to have a thickness of about 1 to 20 nm. Among the above films, the silicon dioxide film is formed by, for example, a thermal oxidation process.

On the other hand, the silicon nitride film is formed by a chemical vapor deposition (CVD) process using as raw materials, for example, trichlorosilane ($SiHCl_3$) and ammonia ($NH_3$), or silicon tetrachloride ($SiCl_4$) and ammonia ($NH_3$). Alternatively, the silicon nitride film is formed by a jet vapor deposition (JVD) process (see M. Khara et al., "Highly Robust Ultra-Thin Gate Dielectric for Giga Scale Technology", Symp. VLSI Technology Digest, Honolulu, Hi., June 1998), or a rapid thermal chemical vapor deposition (RTCVD) process (see S. C. Song et al., "Ultra Thin CVD $Si_3H_4$ Gate Dielectric for Deep-Sub-Micron CMOS Devices", IEDM Tech, Digest. San Francisco, Calif., December 1998). The raw material gases used are the same as those used in a CVD process. Further alternatively, the silicon nitride film is formed by nitriding using $N_2$ radical or atomic nitrogen radical.

The silicon oxide nitride film is formed by subjecting a thermal oxide film to nitriding using nitrogen ($N_2$), dinitrogen oxide ($N_2O$), or ammonia ($NH_3$), or formed by a CVD process using, as raw material gases, a combination of dichlorosilane ($SiH_2Cl_2$), dinitrogen oxide ($N_2O$), and ammonia ($NH_3$), a combination of trichlorosilane ($SiHCl_3$), dinitrogen oxide ($N_2O$), and ammonia ($NH_3$), or a combination of silicon tetrachloride ($SiCl_4$), dinitrogen oxide ($N_2O$), and ammonia ($NH_3$).

Then, on the bottom dielectric film 13a, a film comprised of, for example, silicon nitride ($SiN_x$; x>0) or silicon oxide nitride ($SiO_xN_y$; x, y>0) is deposited to be the charge storage film 13b containing a charge trap shown in FIG. 4 so as to have a thickness of about 1 to 20 nm. Among the above films, the silicon nitride film is formed by a CVD process using as raw materials, for example, dichlorosilane ($SiH_2Cl_2$) and ammonia ($NH_3$), trichlorosilane ($SiHCl_3$) and ammonia ($NH_3$), or silicon tetrachloride ($SiCl_4$) and ammonia ($NH_3$).

On the other hand, the silicon oxide nitride film is formed by a CVD process using as raw material gases, for example, a combination of dichlorosilane ($SiH_2Cl_2$), dinitrogen oxide ($N_2O$), and ammonia ($NH_3$), a combination of trichlorosilane ($SiHCl_3$), dinitrogen oxide ($N_2O$), and ammonia ($NH_3$), or a combination of silicon tetrachloride ($SiCl_4$), dinitrogen oxide ($N_2O$), and ammonia ($NH_3$).

Then, on the charge storage film 13b, a film comprised of silicon dioxide ($SiO_2$), silicon nitride ($SiN_x$; x>0), or silicon oxide nitride ($SiO_xN_y$; x, y>0) is deposited to be the top dielectric film 13c shown in FIG. 4 so as to have a thickness of about 1 to 20 nm. Among the above films, the silicon dioxide film is formed by a CVD process using as raw materials, for example, dichlorosilane ($SiH_2Cl_2$) and dinitrogen oxide ($N_2O$), trichlorosilane ($SiHCl_3$) and dinitrogen oxide ($N_2O$), or silicon tetrachloride ($SiCl_4$) and dinitrogen oxide ($N_2O$).

On the other hand, the silicon nitride film is formed by a CVD process, a JVD process, or an RTCVD process using as raw materials, for example, dichlorosilane ($SiH_2Cl_2$) and ammonia ($NH_3$), trichlorosilane ($SiHCl_3$) and ammonia ($NH_3$), or silicon tetrachloride ($SiCl_4$) and ammonia ($NH_3$).

The silicon oxide nitride film is formed by a CVD process using as raw material gases, for example, a combination of dichlorosilane ($SiH_2Cl_2$), dinitrogen oxide ($N_2O$), and ammonia ($NH_3$); a combination of trichlorosilane ($SiHCl_3$), dinitrogen oxide ($N_2O$), and ammonia ($NH_3$); or a combination of silicon tetrachloride ($SiCl_4$), dinitrogen oxide ($N_2O$), and ammonia ($NH_3$).

Figure 6A:
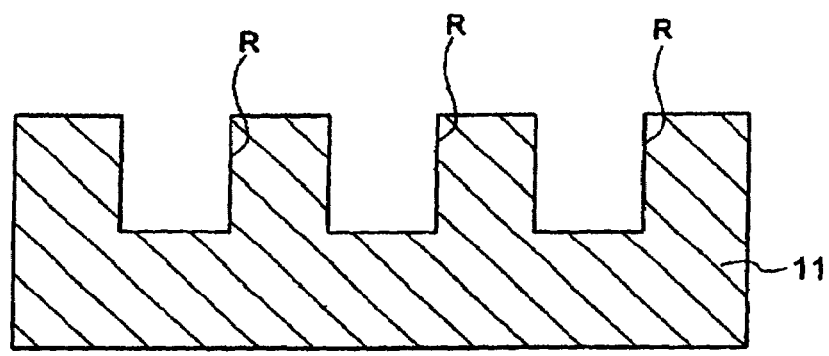
FIGS. 6A and 6B are diagrammatic cross-sectional views illustrating steps in a process for fabricating a non-volatile semiconductor memory device according to the first embodiment.
Figure 6B:
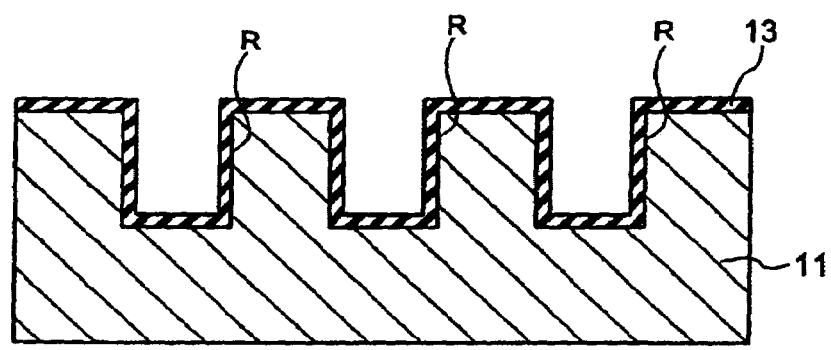

Thus, the gate dielectric film 13 shown in FIG. 6B is formed.

Figure 7A:
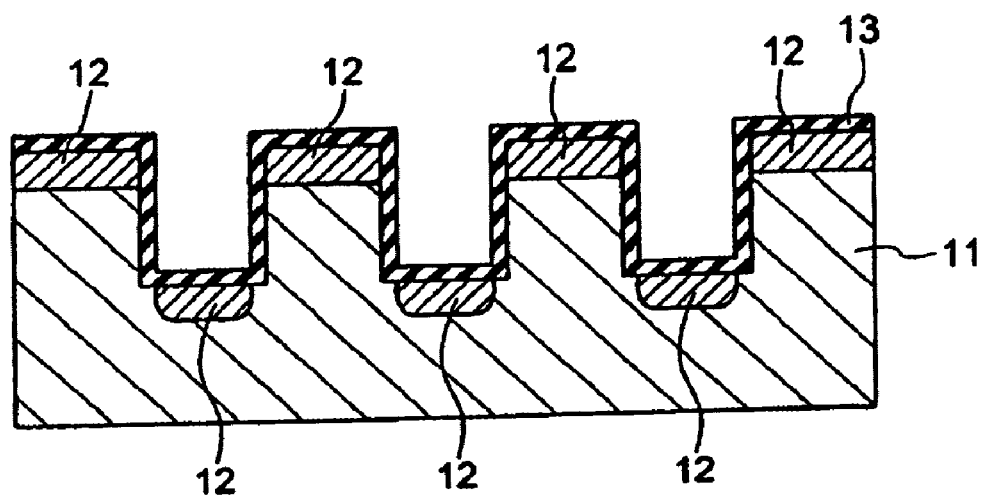
FIGS. 7A and 7B are diagrammatic cross-sectional views illustrating the subsequent steps to the step shown in FIG. 6B.

Then, as shown in FIG. 7A, for example, an n-type impurity, such as $As^+$ or $P^+$, is subjected to ion implantation in a direction substantially perpendicular to the substrate to form the source-drain regions 12 on the upper surface of the convex portion and the bottom surfaces of the concave portions in the semiconductor substrate 11. The ion implantation for forming the source-drain regions 12 may be conducted before the step of forming the gate dielectric film 13.

Figure 7B:
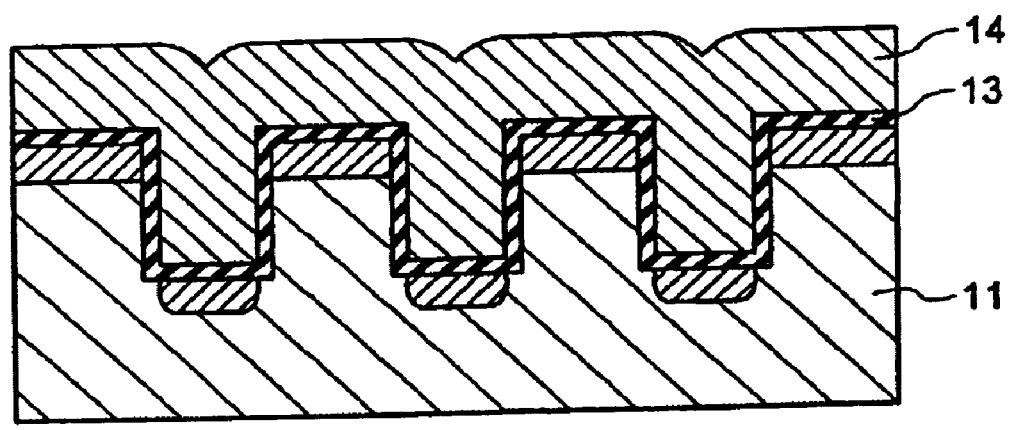

Next, as shown in FIG. 7B, polycrystalline silicon or amorphous silicon to which an impurity is added is deposited and patterned into the stripe form as shown in FIG. 1 to form the gate electrode 14.

In the subsequent steps, if desired, formation of an interlayer dielectric, formation of a contact, formation of an upper wiring layer, and the like are performed to form the non-volatile semiconductor memory device.

In the above-mentioned fabrication process, there is added a step of patterning for the semiconductor substrate 11, which step is not contained in the process for fabricating a conventional cell having no steps, that is, no ridges and no grooves, in the semiconductor substrate 11. This processing step is short, as compared to the whole fabrication process for non-volatile semiconductor memory device, and hence does not cause an increase in cost. The cell has an extremely simple structure and has an advantage in that it can be easily produced.

Next, a first example of bias conditions setting for the above-mentioned memory transistor is explained below.

Specifically, with respect to the memory transistor M21 shown in FIG. 4, explanation is made on the methods of writing, erasing, and reading 1 bit data.

In the data writing, taking the potential of the semiconductor substrate 11 as a basic potential, the source-drain regions 12 are kept 0 V, and a positive voltage, for example, 10 V is applied to the gate electrode 14. In this instant, electrons are stored in the channel formation region CH to form an inversion layer, and part of the electrons in the inversion layer pass through the bottom dielectric film 13a due to a tunnel effect, and are then captured mainly by the charge trap formed in the charge storage film 13b.

In the data reading, taking the potential of the semiconductor substrate 11 as a basic potential, 0 V is applied to one of the source-drain regions 12, for example, 1.5 V is applied to the other, and a voltage in such a range that the number of the electrons captured in the charge storage film 13b is not changed, for example, 2.5 V is applied to the gate electrode 14.

Under the above-mentioned bias conditions, the conductivity of the channel remarkably varies depending on the amount of the electrons captured in the charge storage film 13b.

Specifically, when a satisfactory amount of electrons are injected into the charge storage film 13b, the electrons stored relatively increases the potential of the channel and reduces the electron density of the channel, as compared to a case where a satisfactory amount of electrons are not injected into the charge storage film 13b. Therefore, in such a case, the conductivity between the source and the drain is small. On the other hand, when a satisfactory amount of electrons are not injected into the charge storage film 13b, the potential of the channel is relatively low, so that the conductivity between the source and the drain is large.

The difference in the conductivity of the channel is effectively converted to the change in the current amount in the channel or the change in the drain voltage. The change in the current amount in the channel or the change in the drain voltage is amplified by a detection circuit, for example, a sense amplifier to be read out as memory data.

In the first example of bias conditions setting, the data writing is conducted on the entire surface of the channel. Therefore, even when the directions of the voltages applied to the source and drain are reversed, data reading is possible.

In the data erasing, taking the potential of the semiconductor substrate 11 as a basic potential, 0 V is applied to both the two source-drain regions 12, and a negative voltage, for example, −10 V is applied to the gate electrode 14.

In this instance, the electrons stored in the charge storage film 13b tunnel the bottom dielectric film 13a and are forcibly taken out to the channel formation region CH. As a result, the memory transistor goes back to be in a state before writing (erased state) such that the amount of the electrons captured in the charge storage film 13b is low satisfactorily.

Next, a second example of bias conditions setting for the memory transistor according to the first embodiment is explained below.

In the data writing, taking the potential of the semiconductor substrate 11 as a basic potential, 0 V is applied to one of the two source-drain regions 12, 5 V is applied to the other, and a positive voltage, for example, 10 V is applied to the gate electrode 14.

In this instance, electrons are stored in the channel formation region CH to form an inversion layer, and the electrons supplied to the inversion layer from the source are accelerated by the electric field between the source and the drain to obtain a higher kinetic energy at the drain end portion, thus forming hot electrons having an energy at a level which exceeds the energy barrier of the bottom dielectric film 13a. Part of the hot electrons are captured in a certain probability by the trap formed in the portion of the charge storage film 13b on the drain side.

The data reading is conducted in substantially the same manner as in the first example of bias conditions setting. However, in the second example of bias conditions setting, electrons are stored on the drain side to which 5 V is applied in the data writing. Therefore, in the data reading, a voltage must be applied to between the source and the drain so that the charge storage side becomes a source.

The data erasing is conducted in substantially the same manner as in the first example of bias conditions setting employing FN (Fowler-Nordheim) tunneling or band-to-band tunneling. In the latter, taking the potential of the semiconductor substrate 11 as a basic potential, 5 V is applied to one of or both the two source-drain regions 12, and the source-drain region 12 to which 5 V is not applied is kept 0 V, and −5 V is applied to the gate electrode 14.

In this instance, the surface of the source-drain region 12 to which 5 V is applied undergoes depletion, so that a high electric field is made on the resultant depletion layer, thus causing a band-to-band tunnel current. A hole caused by the band-to-band tunnel current is accelerated by the electric field to obtain a higher energy. The hole having a higher energy is pulled by the gate voltage and injected into the charge trap in the charge storage film 13b.

As a result, the charge of the electrons stored in the charge storage film 13b is negated by the hole injected thereinto, so that the memory transistor goes back to be in an erased state, i.e., a state such that the threshold voltage is low.

Next, a third example of bias conditions setting for the memory transistor according to the first embodiment is explained below. The bias conditions setting is basically the same as the second example of bias conditions setting, but, in the third example of bias conditions setting, 2 bits data is recorded per memory transistor.

In a first data writing, taking the potential of the semiconductor substrate 11 as a basic potential, 0 V is applied to one of the two source-drain regions 12, 5 V is applied to the other, and a positive voltage, for example, 10 V is applied to the gate electrode 14.

In this instance, electrons are stored in the channel formation region CH to form an inversion layer, and the electrons supplied to the inversion layer from the source are accelerated by the electric field between the source and the drain to obtain a higher kinetic energy at the drain end portion, thus forming hot electrons having an energy at a level which exceeds the energy barrier of the bottom dielectric film 13a. Part of the hot electrons are captured in a certain probability by the trap formed in the portion of the charge storage film 13b on the drain side.

Thus, as first data, electrons are captured on a region present mainly at one end portion of the charge storage film 13b.

In a second data writing, the values of the voltages applied to the two source-drain regions 12 in the first data writing are reversed. Specifically, 0 V is applied to one of the two source-drain regions 12, and 5 V is applied to the other.

In this instance, the electrons supplied from the one source-drain region 12 to which 0 V is applied become hot electrons in the other source-drain region 12 to which 5 V is applied, and then injected into a part of the charge storage film 13b on one side. Thus, as second data, electrons are captured in one end portion of the charge storage film 13b independently of the first data. The amount of the electrons injected and the gate length (sidewall height) of the memory transistor are determined so that two 2 bits data injected in the third example of bias conditions setting do not overlap.

In reading of 2 bits data, a direction of the voltage applied to between the source and the drain is determined so that the source-drain region 12 near the portion in which the data to be read is written functions as a source.

In a first data reading, 0 V is applied to one source-drain region 12 near the first data, 1.5 V is applied to the other source-drain region 12, and a voltage in such a range that the number of the electrons captured in the charge storage film 13b is not changed, for example, 2.5 V is applied to the gate electrode 14.

Under the above-mentioned bias conditions, the conductivity of the channel remarkably varies depending on the amount of the electrons captured in the end portion of the charge storage film 13b. Specifically, when a satisfactory amount of electrons are injected into the end portion of the charge storage film 13b on the source side, the electrons stored relatively increases the potential of the portion of the channel on the source side and reduces the electron density of the channel, as compared to a case where a satisfactory amount of electrons are not injected into the end portion of the charge storage film 13b on the source side. Therefore, in such a case, the conductivity between the source and the drain is small.

In this case, the potential of the electrons near the drain is low due to the drain voltage, irrespective of the amount of the electrons in the end portion of the charge storage film 13b on the drain side. Further, the drain end portion is in a pinch-off state in the data reading. Therefore, the influence of the amount of the electrons in the end potion of the charge storage film 13b on the drain side on the conductivity of the channel is small.

That is, the threshold voltage of the transistor reflects the amount of the electrons captured on the source side in which the electric field is lower. Therefore, under the above bias conditions, the first data is read by the detection circuit.

In a second data reading, 0 V is applied to one source-drain region 12 near the second data, 1.5 V is applied to the other source-drain region 12, and 2.5 V is applied to the gate electrode 14.

Under the above-mentioned bias conditions, the electric field in the one source-drain region 12 is lower. Therefore, the second data is read according to the same principle as that in the first data reading.

Data erasing is conducted in substantially the same manner as in the first example of bias conditions setting employing FN tunneling or conducted in substantially the same manner as in the second example of bias conditions setting employing band-to-band tunneling.

In the non-volatile semiconductor memory device according to the present embodiment, by employing a structure having channel formation regions CH along the sidewalls of the trenches R formed in the semiconductor substrate, the degree of integration of the data recording density can be improved without shortening the gate length of the memory transistor to such a region that a short channel effect is caused.

In addition, the charges stored in the charge storage film 13b are localized. Therefore, by locally writing electrons in the source end or drain end, recording of 2 bits per memory transistor can be achieved. In this case, in the memory transistor structure in the present embodiment, for improving the degree of integration in the semiconductor substrate, the gate length of the memory transistor need not be shortened. Therefore, even when the degree of integration is improved, the charge storage regions in which electrons are written separately in the source end and the drain end do not overlap, thus enabling the operation of recording of 2 bits per memory transistor.

Further, by employing a structure such that the channel formation region CH is of vertical type and charges are stored in the charge storage film 13b having discrete charge storage means, such as a charge trap, differing from a case where the above structure is applied to the floating gate-type, the following advantages can be obtained.

First, in the step of forming a trench R in the semiconductor substrate 11, when, for example, an etching process having strong anisotropy is employed for improving the verticality of the sidewall of the trench, the sidewall of the trench R is likely to suffer at least a small damage. In such a case, the bottom dielectric film 13a to be formed on the sidewall of the trench which suffers an etching damage can be a poor quality film. In other words, the bottom dielectric film 13a having a number of defects is formed. When the vertical-type structure is applied to the floating gate-type, charges move freely in the layer of the floating gate, and therefore all the charges stored in the floating gate possibly leak into the substrate through the defects locally formed in the bottom dielectric film 13a. In contrast, when the charge trap formed on the bottom dielectric film 13a is spatially discrete, merely the charges stored in the charge trap near the defects leak, so that leakage of the charges into the semiconductor substrate through the defects can be suppressed, thus obtaining excellent properties including a data storage property and reliability, as compared to those of the floating gate-type.

Further, in the present embodiment, by utilizing the localization of the charges stored, recording of 2 bits data per memory cell is possible, but, in the floating gate-type, the operation of recording of 2 bits data per memory cell is impossible.

Second Embodiment

The present embodiment illustrates a non-volatile semiconductor memory device using, as charge storage means for the memory transistor, a number of conductors each having a particle diameter of, for example, 10 nm or less (hereinafter, referred to as "small particle-size conductors"), which are insulated from one another and embedded in the gate dielectric film.

Figure 8:
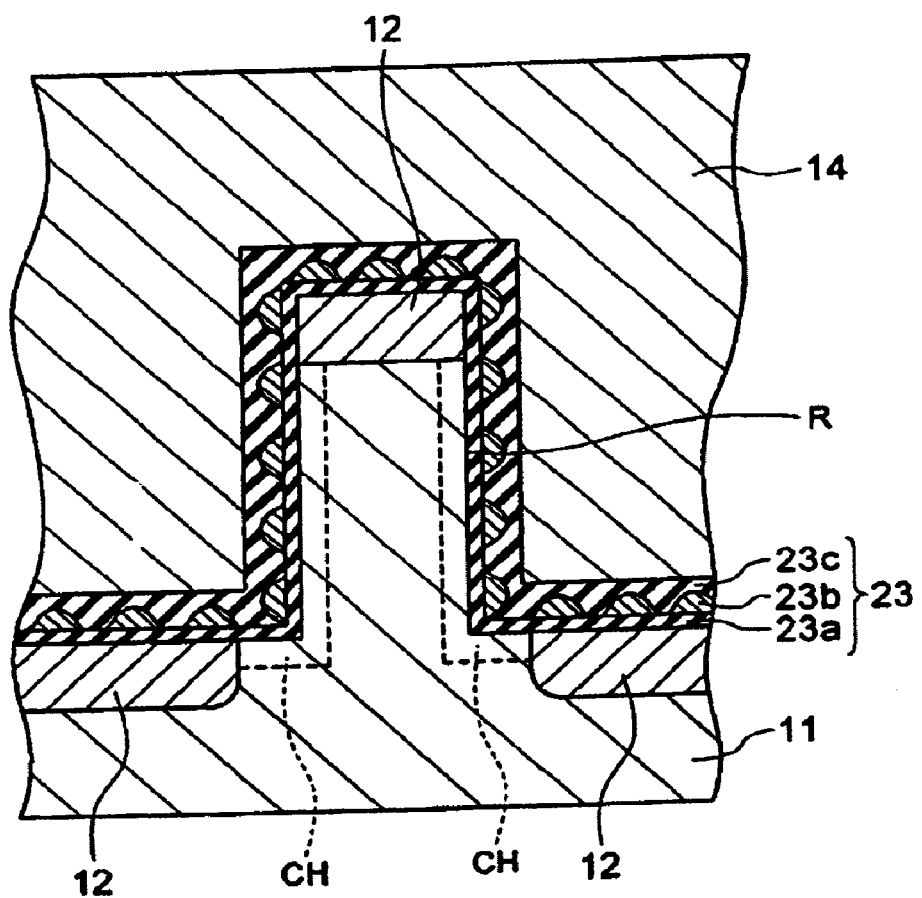
FIG. 8 is a diagrammatic cross-sectional view of a memory transistor according to the second embodiment.

FIG. 8 is an enlarged diagrammatic cross-sectional view showing a device structure of the memory transistor using small particle-size conductors as the charge storage means.

In the non-volatile memory transistor of the present embodiment, a gate dielectric film 23 comprises a bottom dielectric film 23a, small particle-size conductors 23b as charge storage means on the film 23a, and a dielectric film 23c which coats the small particle-size conductors 23b.

Other constituents, namely, the semiconductor substrate 11, the channel formation region CH, the source-drain region 12, and the gate electrode 14 are the same as those in the first embodiment.

The small particle-size conductors 23b are comprised of a conductor, for example, fine amorphous ($Si_xGe_{1-x}$; $0 \leq x \leq 1$) or polycrystalline ($Si_xGe_{1-x}$; $0 \leq x \leq 1$). In addition, the small particle-size conductors 23b preferably have a size (diameter) of 10 nm or less, for example, about 4.0 nm, and the individual small particle-size conductors are spatially separated from one another at an interval of, for example, about 0.4 nm by the dielectric film 23c.

In the present embodiment, the thickness of the bottom dielectric film 23a can be appropriately selected in the range of from 2.6 to 5.0 nm according to the use therefor. The thickness used here is about 4.0 nm.

A process for fabricating the memory transistor having the above-mentioned construction is described below.

First, the bottom dielectric film 23a is deposited in substantially the same manner as in the first embodiment, and then, an aggregate of small particle-size conductors of $Si_xGe_{1-x}$ formed at the initial stage of the deposition of $Si_xGe_{1-x}$ using, for example, an LP-CVD process is formed on the bottom dielectric film 23a. The small particle-size conductors of $Si_xGe_{1-x}$ are formed at a deposition temperature of about 500 to 900° C. using silane ($SiH_4$) or dichlorosilane (DCS), germane ($GeH_4$), and hydrogen as raw material gases.

The density and size of the small particle-size conductors can be controlled by adjusting the partial pressure or the flow rate of each of silane or dichlorosilane and hydrogen. The higher the hydrogen partial pressure is, the higher the density of the nucleus for the small particle-size conductors becomes. Alternatively, $SiO_x$ having a nonstoichiometric composition is deposited at a deposition temperature of about 500 to 800° C. using silane or dichlorosilane and dinitrogen oxide ($N_2O$) as raw material gases, and then annealed at a temperature as high as 900 to 1,100° C. to separate $SiO_2$ from the Si small particle-size conductors phase, thus forming an aggregate of Si small particle-size conductors embedded in $SiO_2$.

Then, the dielectric film 23c is deposited in a thickness of, for example, 7 nm by an LP-CVD process so that the small particle-size conductors 23b are embedded in the dielectric film 23c. In the LP-CVD process, when a mixed gas of dichlorosilane (DCS) and dinitrogen oxide ($N_2O$) is used as a raw material gas and the substrate temperature is, for example, 700° C., the small particle-size conductors 23b are embedded in the dielectric film 23c.

Then, a conductive film which functions as a word line is deposited, followed by a step of patterning the gate electrode 14 collectively, thus obtaining the memory transistor.

The thus formed small particle-size conductors 23b function as carrier traps which are two-dimensionally discrete. The small particle-size conductors 23b can individually store therein several electrons injected. Each of the small particle-size conductors 23b may be further downsized so as to store therein a single electron.

In the non-volatile semiconductor memory device according to the present embodiment, like in the first embodiment, the degree of integration of the data recording density can be improved.

In addition, like in the first embodiment, the charges stored in the small particle-size conductors 23b are localized. Therefore, by locally writing electrons in the source end and the drain end, recording of 2 bits per memory transistor can be achieved. Further, like in the first embodiment, even when defects are locally caused in the bottom dielectric film 23a, the small particle-size conductors 23b formed on the bottom dielectric film 23a as charge storage means are spatially discrete, and therefore merely the charges stored in the small particle-size conductors 23b near the defects leak, so that leakage of the charges into the semiconductor substrate through the defects can be suppressed, thus obtaining excellent properties including a data storage property and reliability, as compared to those of the floating gate-type.

The non-volatile semiconductor memory device of the present invention is not limited to those described in the above embodiments.

For example, the construction of the gate dielectric film 13 in the memory transistor is not limited to the three-layer dielectric film used in the so-called MONOS-type memory device described in the above embodiments. The requirements for the gate dielectric film are that the gate dielectric film comprises a plurality of dielectric films laminated, and that charge storage means, such as a charge trap, be discrete. Other constructions can be employed as long as they satisfy the two requirements.

For example, there can be employed a two-layer construction in the so-called MNOS-type memory device, which comprises a bottom dielectric film comprised of silicon dioxide or the like, and a film formed thereon having charge storage ability and being comprised of silicon nitride or the like.

It is known that a dielectric film comprised of a metal oxide, such as aluminum oxide ($Al_2O_3$), tantalum oxide ($Ta_2O_5$), or zirconium oxide ($ZrO_2$), contains a number of traps, and therefore it can be used in a MONOS-type or MNOS-type memory device as a film having charge storage ability. Further, as a material for the charge storage film 13b, a film comprised of other metal oxide, for example, an oxide of titanium, hafnium, or lanthanum, or a film comprised of a silicate of tantalum, titanium, zirconium, hafnium, or lanthanum can be used.

When aluminum oxide ($Al_2O_3$) is selected as a material for the charge storage film 13b, a CVD process using as raw material gases, for example, aluminum chloride ($AlCl_3$), carbon dioxide ($CO_2$), and hydrogen ($H_2$), or pyrolysis of aluminum alkoxide (e.g., $Al(C_2H_5O)_3$, $Al(C_3H_7O)_3$, or $Al(C_4H_9O)_3$) is used.

When tantalum oxide ($Ta_2O_5$) is selected as a material for the charge storage film 13b, a CVD process using as raw material gases, for example, tantalum chloride ($TaCl_5$), carbon dioxide ($CO_2$), and hydrogen ($H_2$), or pyrolysis of $TaCl_x(OC_2H_5)_2C_5H_7O_2$ or $Ta(OC_2H_5)_5$ is used.

When zirconium oxide ($ZrO_x$) is selected as a material for the charge storage film 13b, a process of sputtering, for example, Zr in an oxygen gas atmosphere is used.

Like the charge storage film 13b, a material for each of the bottom dielectric film 13a and the top dielectric film 13c is not limited to the above-mentioned silicon dioxide, silicon nitride, and silicon oxide nitride, but may be a material selected from, for example, aluminum oxide ($Al_2O_3$), tantalum oxide ($Ta_2O_5$), and zirconium oxide ($ZrO_2$). The processes for forming these metal oxides are as mentioned above.

Further, each of the bottom dielectric film 13a and the top dielectric film 13c may be other metal oxide film, and a film comprised of an oxide of titanium, hafnium, or lanthanum, or a film comprised of a silicate of tantalum, titanium, zirconium, hafnium, or lanthanum can be used.

In addition, a variety of modifications can be made on the above embodiments as long as an effect aimed at by the present invention can be obtained.

What is claimed is:

1. A non-volatile semiconductor memory device comprising:
   a first conductive semiconductor having a plurality of steps on a surface thereof;
   a second conductive semiconductor region formed on an upper portion and a bottom portion of each of said steps and being separated in a direction perpendicular to a main surface of said first conductive semiconductor to function as a source or a drain;
   a gate dielectric film containing therein charge storage means which is spatially discrete and being formed on said first conductive semiconductor so as to coat at least a sidewall and the upper portion of each of said steps, said gate dielectric film including a lower dielectric film formed on said first conductive semiconductor, a charge storage film including said charge storage means formed on said lower dielectric film, and an upper dielectric film formed on said charge storage film; and
   a gate electrode formed on said gate dielectric film;
   wherein at least one of the upper dielectric film and the lower dielectric film are formed from a material selected from a group consisting of aluminum oxide, tantalum oxide and zirconium oxide.

2. The non-volatile semiconductor memory device according to claim 1 wherein the upper dielectric film is formed from aluminum oxide.

3. The non-volatile semiconductor memory device according to claim 2 wherein the upper dielectric film is formed by a chemical vapor deposition process.

4. The non-volatile semiconductor memory device according to claim 3 wherein the chemical vapor deposition process is performed using a raw material gas including a gas selected from a group consisting of a first gas comprising aluminum chloride, carbon dioxide and hydrogen and a second gas comprising pyrolysis of aluminum alkoxide.

5. The non-volatile semiconductor memory device according to claim 1 wherein the lower dielectric film is formed from aluminum oxide.

6. The non-volatile semiconductor memory device according to claim 5 wherein the lower dielectric film is formed by a chemical vapor deposition process.

7. The non-volatile semiconductor memory device according to claim 6 wherein the chemical vapor deposition process is performed using a raw material gas including a gas selected from a group consisting of a first gas comprising aluminum chloride, carbon dioxide and hydrogen and a second gas comprising pyrolysis of aluminum alkoxide.

8. The non-volatile semiconductor memory device according to claim 1 wherein the upper dielectric film is formed from tantalum oxide.

9. The non-volatile semiconductor memory device according to claim 8 wherein the upper dielectric film is formed by a chemical vapor deposition process.

10. The non-volatile semiconductor memory device according to claim 9 wherein the chemical vapor deposition process is performed using a raw material gas including a gas selected from a group consisting of a first gas comprising tantalum chloride, carbon dioxide and hydrogen and a second gas comprising pyrolysis of $TaCl_2(OC_2H_5)_2C_5H_7O_2$ or $Ta(OC_2H_5)_5$.

11. The non-volatile semiconductor memory device according to claim 1 wherein the lower dielectric film is formed from tantalum oxide.

12. The non-volatile semiconductor memory device according to claim 11 wherein the lower dielectric film is formed by a chemical vapor deposition process.

13. The non-volatile semiconductor memory device according to claim 12 wherein the chemical vapor deposition process is performed using a raw material gas including a gas selected from a group consisting of a first gas comprising tantalum chloride, carbon dioxide and hydrogen and a second gas comprising pyrolysis of $TaCl_2(OC_2H_5)_2C_5H_7O_2$ or $Ta(OC_2H_5)_5$.

14. The non-volatile semiconductor memory device according to claim 1 wherein the upper dielectric film is formed from zirconium oxide.

15. The non-volatile semiconductor memory device according to claim 14 wherein the upper dielectric film is formed by a sputtering process.

16. The non-volatile semiconductor memory device according to claim 15 wherein the sputtering process is performed in an oxygen gas atmosphere.

17. The non-volatile semiconductor memory device according to claim 1 wherein the lower dielectric film is formed from zirconium oxide.

18. The non-volatile semiconductor memory device according to claim 17 wherein the lower dielectric film is formed by a sputtering process.

19. The non-volatile semiconductor memory device according to claim 18 wherein the sputtering process is performed in an oxygen gas atmosphere.

* * * * *